(12) United States Patent
McAnn et al.

(10) Patent No.: US 8,514,544 B2
(45) Date of Patent: Aug. 20, 2013

(54) ELECTROSTATIC CLAMP OPTIMIZER

(75) Inventors: Peter McAnn, Medina, NY (US);
Toshio Uehara, Tokyo (JP)

(73) Assignee: Trek, Inc., Medina, NY (US)

( * ) Notice: Subject to any disclaimer, the term of this patent is extended or adjusted under 35 U.S.C. 154(b) by 318 days.

(21) Appl. No.: 12/852,482

(22) Filed: Aug. 7, 2010

(65) Prior Publication Data
US 2011/0032654 A1  Feb. 10, 2011

Related U.S. Application Data

(60) Provisional application No. 61/232,028, filed on Aug. 7, 2009.

(51) Int. Cl.
*H01L 21/683* (2006.01)
*H01T 23/00* (2006.01)

(52) U.S. Cl.
USPC ........................................................ 361/234

(58) Field of Classification Search
USPC ........................................................ 361/234
See application file for complete search history.

(56) References Cited

U.S. PATENT DOCUMENTS

| | | | |
|---|---|---|---|
| 5,436,790 A | 7/1995 | Blake et al. | |
| 5,452,177 A | 9/1995 | Frutiger | |
| 5,563,798 A | 10/1996 | Berken et al. | |
| 5,793,192 A | 8/1998 | Kubly et al. | |
| 6,075,375 A | 6/2000 | Burkhart et al. | |
| 6,097,492 A | 8/2000 | Kondo et al. | |
| 6,198,616 B1 | 3/2001 | Dahimene et al. | |
| 6,377,060 B1 | 4/2002 | Burkhart et al. | |
| 6,388,861 B1 | 5/2002 | Frutiger | |
| 6,741,446 B2 * | 5/2004 | Ennis ........................... | 361/234 |
| 7,072,166 B2 | 7/2006 | Qin et al. | |

* cited by examiner

*Primary Examiner* — Dharti Patel
(74) *Attorney, Agent, or Firm* — Hodgson Russ LLP

(57) ABSTRACT

A system which may be used to control, monitor and optimize an electrostatic clamp is disclosed. In one embodiment of the invention, there is a computer, a control circuit, and at least one amplifier. Also, a signal assessing circuit may be included and used to provide a sensing signal to an output signal of the control circuit. The signal assessing circuit may provide a sensing signal that can be used to monitor the capacitance of the electrostatic clamp. Further, the signal assessing circuit may include circuitry which monitors performance of the electrostatic clamp, and provide performance information to the control circuit.

15 Claims, 10 Drawing Sheets

Clamp Series 1
##

| time | voltage |
|---|---|
| 0 | 0 |
| 0.0005 | 0.01 |
| 0.001 | 0.02 |
| 0.0015 | 0.03 |
| 0.002 | 0.04 |
| 0.0025 | 0.05 |
| 0.003 | 0.06 |
| 0.0035 | 0.07 |
| 0.004 | 0.08 |
| 0.0045 | 0.09 |
| 0.005 | 0.1 |
| 0.0055 | 0.11 |
| 0.006 | 0.12 |
| 0.0065 | 0.13 |
| 0.007 | 0.14 |
| 0.0075 | 0.15 |
| 0.008 | 0.16 |
| 0.0085 | 0.17 |
| 0.009 | 0.18 |
| 0.0095 | 0.19 |
| 0.01 | 0.2 |
| 0.0105 | 0.21 |
| 0.011 | 0.22 |
| 0.0115 | 0.23 |
| 0.012 | 0.24 |
| 0.0125 | 0.25 |
| 0.013 | 0.260 |
| 0.0135 | 0.27 |
| 0.014 | 0.28 |
| 0.0145 | 0.29 |
| 0.015 | 0.3 |
| 0.0155 | 0.31 |
| 0.016 | 0.32 |
| 0.0165 | 0.33 |
| 0.017 | 0.34 |
| 0.0175 | 0.35 |
| 0.018 | 0.36 |
| 0.0185 | 0.37 |
| 0.019 | 0.38 |
| 0.0195 | 0.39 |
| 0.02 | 0.4 |
| 0.0205 | 0.41 |
| 0.021 | 0.42 |
| 0.0215 | 0.43 |
| 0.022 | 0.44 |
| 0.0225 | 045 |
| 0.023 | 0.46 |
| 0.0235 | 0.47 |
| 0.024 | 0.48 |

FIG. 2

ELECTROSTATIC CLAMP OPTIMIZER

CROSS-REFERENCE TO RELATED APPLICATION

This application claims the benefit of priority to U.S. provisional patent application Ser. No. 61/232,028, filed on Aug. 7, 2009.

FIELD OF THE INVENTION

The present invention relates to electrostatic clamps. The present invention may be embodied as a system or method for optimizing the operation of electrostatic clamps.

BACKGROUND OF THE INVENTION

Electrostatic clamps are used in the semiconductor industry to firmly hold a silicon wafer while various processes are performed on the wafer. Relative to mechanical clamps, electrostatic clamps have significant advantages, which include (a) an increased ability to transfer heat, (b) a reduction in mechanical wear on the wafer, which results is chipping and other mechanical defects, (c) an increase in the effective area of the wafer that may be used to produce saleable products, (d) a decrease in the number of particulates generated, (e) reduced contamination of the clamp from the ion beam used in sputtering, and (f) uniformity of the clamping force across the surface of the wafer.

The semiconductor industry is not the only industry which uses electrostatic clamps. For example, several LCD (liquid crystal display) manufacturers use electrostatic clamping techniques to hold special glass during processing. The solar cell industry also uses electrostatic clamps.

An electrostatic clamp holds a work piece (e.g. semiconductor wafer, glass or other object being worked on) by creating a capacitor. In order that the work piece can be held to the electrostatic clamp, either the work piece is conductive, or a conductive plating is applied to the work piece before clamping. In a simple electrostatic clamp, the work piece becomes an electrode of the capacitor and the clamp provides the other electrode. If the clamp has only a single electrode, then the work piece must have an electrical connection to ground, typically via a conductor or ionized gas. When the clamp electrodes are charged, the work piece becomes oppositely charged in the area of the electrode, and is attracted to the clamp electrode. The clamping force can be calculated using Coulomb's law.

The electrostatic clamp provides a thin layer of material between the clamp electrodes and the work piece. In this document, the material provided by the electrostatic clamp that resides between the clamp electrode(s) and the work piece is called the "barrier material". Typically, the thickness of the barrier material is on the order of tens of microns. Depending on the electrostatic clamp technology, the barrier material can be either a pure dielectric (in the case of a Coulombic clamp) or a semi-insulative material (in the case of a Johnsen-Rahbek clamp).

In more complex electrostatic clamps, the clamp provides more than one electrode. In the case of a clamp that has two electrodes (a.k.a. a bi-polar clamp), the charge on a first one of the clamp electrodes is opposite polarity to the charge on a second one of the electrodes. This arrangement forms a capacitance from one clamp electrode, through the barrier material, to the work piece, back through the barrier material and then to the other clamp electrode. Electrostatic clamps having more than two electrodes are a variation on the bi-polar clamp, but operate in a manner that is similar to the bi-polar clamp.

One of the issues with electrostatic clamps is the length of time it takes for the work piece to "declamp". Declamping is a process where the work piece is released from the electrostatic clamp, and the work piece is then moved to its next processing station. Declamping can be hindered by a built up residual static charge, which prevents release of the work piece.

Another issue results from the thickness of the barrier material, which is located between the work piece and the electrodes. The barrier material is very thin, and can be damaged easily. Damage to the barrier material may result in detectable current flowing between the electrode and the work piece. Such a fault results in reduced force holding the work piece to the clamp, which may cause the work piece to move during processing, or the work piece may leave the clamp surface altogether. Also, arcing may occur between the work piece and the electrodes, and such arcing can damage the work piece.

Additional issues arise which are not directly related to the electrostatic clamp itself. For example, if a work piece is damaged, the quality of clamping will suffer. In the event that a work piece is seriously warped, clamping may not flatten the work piece enough, thereby resulting in an imperfect or non-existent force between the work piece and the clamp. Additionally, in the event that an open circuit is created, for example due to either electrical or mechanical stress in the circuitry between the high voltage supply and the electrostatic clamp, then the high voltage may not appear on the electrodes, and the work piece will be partially or completely unclamped.

To solve some or all of these issues, a tool is needed that can be used to detect errors and optimize operational parameters of an electrostatic clamp. Such a tool would allow scientists and engineers to monitor leakage currents, work piece voltages and capacitances associated with electrostatic clamping, while at the same time, allowing unique waveforms for clamping, work piece processing, and de-clamping to be output to the electrostatic clamp. Currently, electrostatic clamp manufacturers, power supply designers, and end users tend to work independently to create a system that works, and such a tool would allow flexibility amongst these groups to create a robust system that optimizes not only the process flow, but safety design margins as well.

SUMMARY OF THE INVENTION

The invention may be embodied as a system for controlling and monitoring the operation and performance of an electrostatic clamp (sometimes referenced as "ESC"). Such a system may include (a) a computer programmed to accept control information from a user, and provide digital commands corresponding to the control information; (b) a control circuit having circuitry capable of accepting the digital commands, and providing an output signal corresponding to the digital commands; (c) at least one amplifier, having an input port for receiving the output signal from the control circuit, and an output port for providing a high voltage control signal to at least one electrode of an ESC.

The computer may provide an interface to the user in the form of a spreadsheet for entry of the control information. The spreadsheet may have input boxes for entry of the control information.

The system may include a signal assessing circuit for providing a sensing signal to the control circuit output signal. The sensing signal may be a voltage sine wave.

The signal assessing circuit may monitor performance of the ESC. To accomplish this task, the signal assessing circuit may include current monitoring circuitry, which may monitor currents of the amplifier. Furthermore, the signal assessing circuit may include circuitry for monitoring voltages of the amplifier.

The invention may be embodied as a method of monitoring for the purpose of optimizing operation of an electrostatic clamp. In one such method, control information is provided to a computer that is programmed to provide digital commands corresponding to the control information. Digital commands may be created with the computer. The digital commands may be received at a control circuit having circuitry that is capable of accepting the digital commands, and that is capable of providing an output signal corresponding to the digital commands. The control circuit creates the output signal and sends the output signal to the amplifier. The amplifier receives the output signal, and amplifies the output signal to provide a high voltage control signal to an electrode of an electrostatic clamp. The operation of the amplifier may be monitored, and monitoring information corresponding to the operation of the amplifier may be provided. Subsequent control information provided to the computer may be adjusted based on the monitoring information A sensing signal may be provided and combined with the output signal. The presence of a known sensing signal may be used to monitor operation of the amplifiers.

Monitoring operation of the amplifier may be accomplished by monitoring currents and/or voltages of the amplifier. For example, the monitored currents may be AC or DC currents associated with the amplifiers, such as those produced by the amplifiers. The monitored voltages may be AC or DC voltages associated with the amplifiers, such as those produced by the amplifiers.

BRIEF DESCRIPTION OF THE DRAWINGS

For a fuller understanding of the nature and objects of the invention, reference should be made to the accompanying drawings and the subsequent description. Briefly, the drawings are:

FIG. 2 is an input spreadsheet that may be used to provide control information;

FURTHER DESCRIPTION OF THE INVENTION

Figure 1:
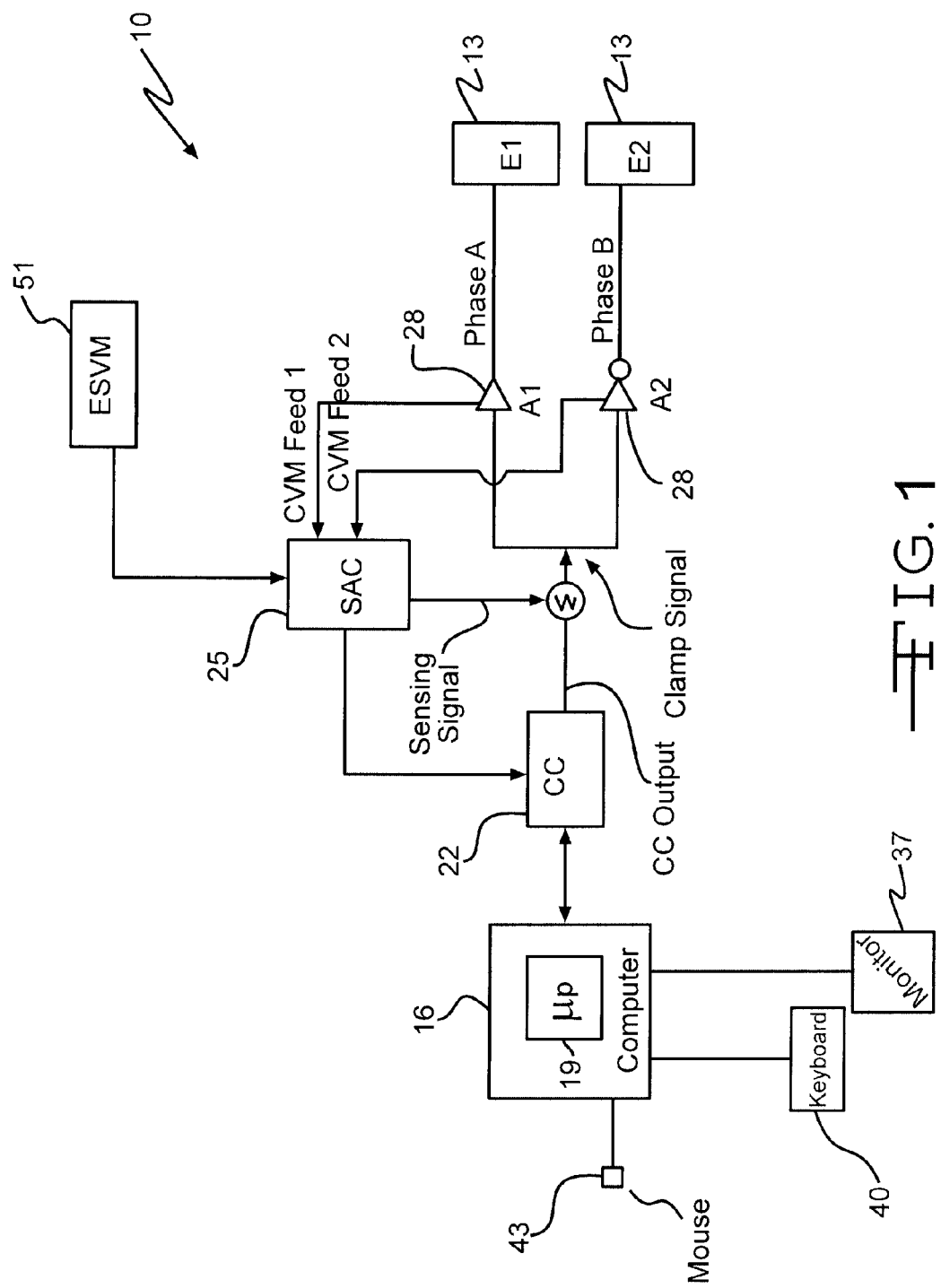
FIG. 1 is a block diagram of a system that is in keeping with the invention.

The invention may be embodied as a system 10, which is capable of providing signals to the clamp electrodes 13 of an ESC, and is capable of monitoring various components of an electrostatic clamping system. FIG. 1 is a block diagram showing components of one system 10 that is in keeping with the invention. In FIG. 1, there is shown a computer 16, which has a microprocessor 19. The computer 16 is communicatively connected to a control circuit ("CC") 22. The computer 16 may provide information to the CC 22 and the CC 22 may provide information to the computer 16. A signal assessing circuit ("SAC") 25 is shown in FIG. 1 being communicatively connected to the CC 22. The SAC 25 may provide certain signals to an output of the CC 22, and the SAC 25 may provide operational data to the CC 22. The clamp signal provided by the CC 22 and SAC 25, which is typically low voltage, is provided to one or more amplifiers 28. FIG. 1 shows two amplifiers 28 (A1 and A2), but the invention may be practiced with one or more amplifiers 28. The amplifiers 28 amplify the low voltage clamp signal in order to provide a high voltage control signal to one or more clamp electrodes 13. FIG. 1 shows two electrodes 13 (E1 and E2), but the invention may be practiced with one or more electrodes 13. The electrodes 13 are used to hold a work piece 31, such as a wafer or other object, via capacitative forces.

Having provided a general overview of one system that is in keeping with the invention, additional details will now be provided. The computer 16 may have software running thereon for executing certain functions. For example, the computer 16 may serve as an interface for a user to provide control information to the CC 22, and to receive operation information from the CC 22. In order to serve as an interface for a user, who desires to provide control information, in one embodiment of the invention, a spreadsheet 34 is provided via the computer 16 to a user. For example, the spreadsheet 34 may be displayed on a monitor 37, and the user may use a keyboard 40/mouse 43 input system to input the control information.

FIG. 2 shows a spreadsheet 34 that is in keeping with the invention. In FIG. 2, there are two columns, each having a portion of the control information. One column lists times, and the other column lists voltages. Each row of the spreadsheet 34 represents the time at which the voltage should be applied to the electrodes 13. As such, the control information shown on the spreadsheet 34 are the times at which the corresponding voltages should be provided to the electrodes 13.

Using the spreadsheet 34, the user may easily provide instructions about a high voltage control signal that is desired by the user to be applied to the clamp electrodes 13. A user of the system may place control information into the boxes 45 of the spreadsheet 34. The computer 16 has running thereon software for translating the control information provided via the spreadsheet 34 into a set of digital commands that are provided to the CC 22. Toward this end, the CC 22 includes circuitry which will receive the digital commands from the computer 16, and create an output signal corresponding to the digital commands.

The SAC 25 includes circuitry which is equipped to create and add a sensing signal to the CC's 22 output signal, and the combined signal is a low voltage clamp signal. The sensing signal from the SAC 25 may be a low voltage sine wave, which can be used to detect capacitance of the ESC.

The low voltage clamp signal is provided to the amplifiers 28. The amplifiers 28 produce a high voltage control signal that corresponds to the low voltage clamp signal. The high voltage control signal is provided to the clamp electrodes 13.

Figure 3:
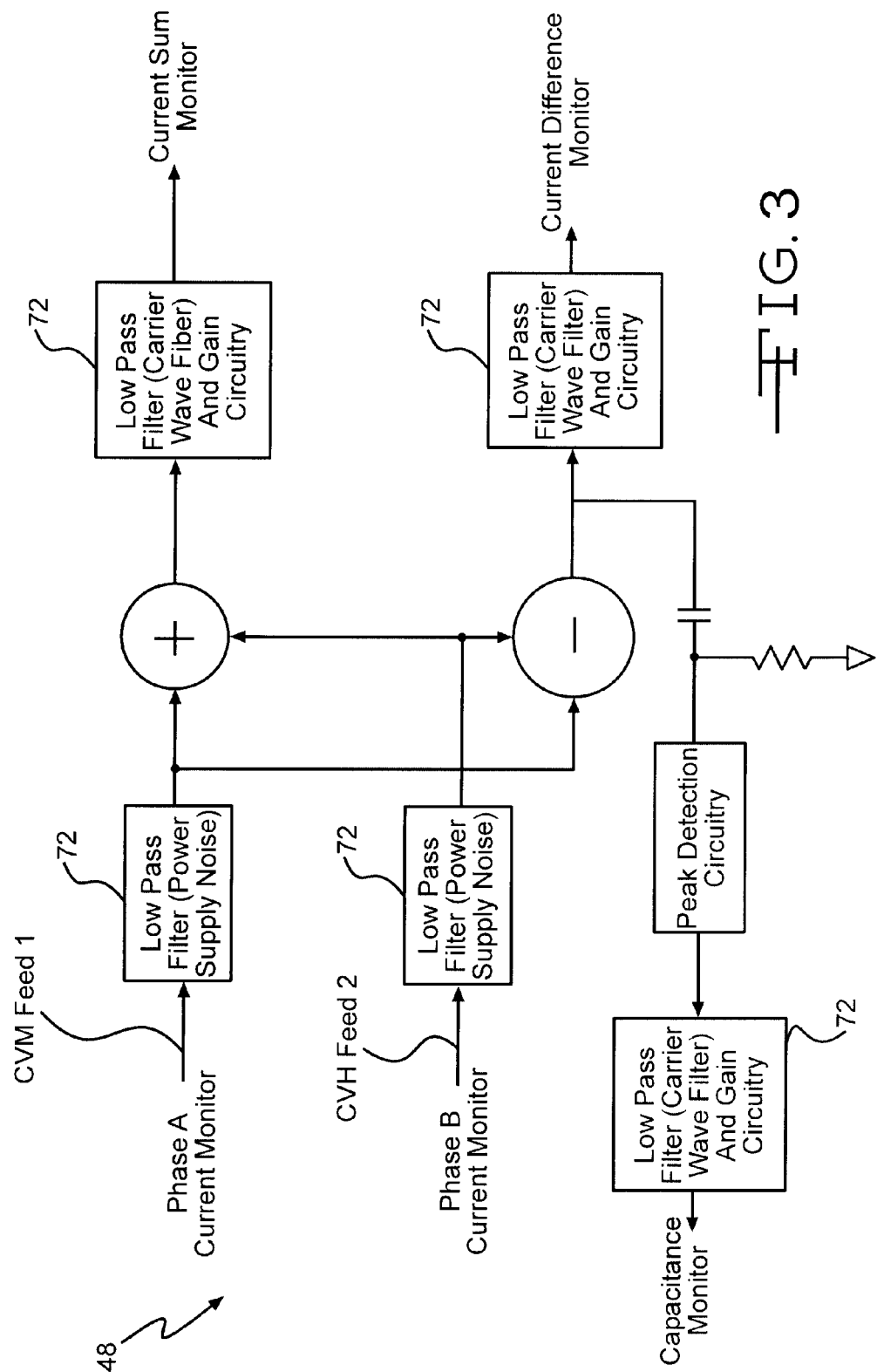
FIG. 3 is a block diagram of current monitors that may be used in the SAC.

In addition to providing a sensing signal to the CC's 22 output signal, the SAC 25 may include circuitry which is communicatively connected to the amplifiers in a manner that will allow the SAC 25 to monitor operation of the clamp. For example, in FIG. 1 there are two amplifiers 28 shown. From each amplifier 28, there is shown a means for communicating, which are labeled "CVM Feed 1" and "CVM Feed 2". In this setting, "CVM" stands for Current/Voltage Monitor. Thus, the CVM Feed lines provide information to the SAC 25, which may be provided in the form of voltages and currents existing within the amplifiers 28. The SAC 25 may include monitoring circuits that can provide useful information about the performance and operation of the ESC. FIG. 3 depicts a portion of the SAC 25 that is dedicated to monitoring currents.

The SAC 25 may include circuitry to do the following:
   (a) monitor and collect data regarding the phase A voltage.
   (b) monitor and collect data regarding the phase B voltage.
   (c) monitor and collect data regarding the sum of the high voltage control signal currents from phases A and B, which can be used to trouble shoot and characterize system operation.
   (d) monitor and collect data regarding the difference between the output currents leaving each amplifier 28, which may be used to trouble shoot and characterize system operation.
   (e) detect capacitance, which can be detected as a result of adding the sensing signal that was provided by the SAC 25 to the CC's 22 output signal.
   (f) monitor the DC current sum from the amplifiers 28.
   (g) monitor the DC current differences from the amplifiers 28 (which may be used to detect leakage currents).
   (h) monitor AC current from the amplifiers 28, which may be processed and used for capacitance measurement.

The monitoring circuitry of the SAC 25 may provide to the CC 22 analog signals representing the monitored and detected information. The CC 22 may then produce digital signals corresponding to the SAC's 25 analog monitoring signals. The digital monitoring signals provided by the CC 22 may be provided to the computer 16 for analysis. The analysis accomplished by the computer 16 may be made via software that is running on the computer 16. The software may cause the microprocessor 19 to process the digital monitoring signals in a way that provides useful information to the user via the monitor 37. In this manner, the user may be provided with useful information about the operation of the ESC. For example, the information provided by the CC 22 to the computer 16 may be provided to the user in the form of a spreadsheet 34, graph, or other manner.

Having provided some detail about an embodiment of the invention, additional detail about the invention is provided below. The computer 16, CC 22 and SAC 25 may be packaged as a tool to help the electrostatic clamp manufacturer, power supply designer and/or end user achieve optimum performance of their individual responsibilities. For example, the invention may use information about (1) currents and capacitances resulting from the presence and clamping quality of the work piece 31, and (2) residual clamping voltages to provide information that is useful in determining optimum declamping waveforms, or to experiment with clamping and declamping parameters to achieve optimum performance of a clamping system with respect to different types of work pieces 31.

In the embodiment depicted in FIG. 1, there are two high voltage amplifiers 28. These amplifiers 28 produce high voltage control signals that are applied to the electrodes 13 of the ESC. The input to these amplifiers 28 is provided by the CC 22, and the input to the CC 22 is provided by the computer 16. The computer 16 may be programmed to provide a user-defined process for (a) clamping the work piece 31, (b) holding the work piece 31 while the work piece 31 is acted on by other processes, such as ion implantation, chemical vapor deposition, and others, and (c) declamping the work piece 31. Instructions about a desired clamping procedure may be provided to the computer 16 via a spreadsheet 34. In this manner, the clamping system can be easily controlled to (among other things):
   (a) optimize the clamping force.
   (b) avoid stressing the ESC by applying excess voltage.
   (c) avoid stressing the ESC by subjecting it to excess current.
   (d) test new and different barrier materials.
   (e) minimize residual charge (voltage) on the work piece 31.
   (f) test various signals provided to the clamp electrodes in order to identify optimum parameters.
   (g) determine the optimum declamping wave form to provide the fastest work piece 31 throughput.

With respect to item "c" in the immediately prior list above, avoiding rapid changes in voltage (dV/dT) is important for avoiding excessive current, which is important for at least the following two reasons. First, excessive current resulting from a rapid dV/dt can melt and even open the circuit from the high voltage amplifiers 28 to the ESC electrodes 13. Second, rearrangement of the dipoles in the barrier material can result from rapid polarity change, especially if the barrier material is crystalline in structure, and such dipole rearrangement can cause mechanical perturbations, which can cause the barrier material to crack and fail. The expected current can be easily calculated from the equation $i = C\, dV/dt$, where "i" is the current in amps, "C" is the capacitance, and "dV/dt" is the change in voltage versus time. For example, a typical clamping system with a wafer 31 on the clamp can have a capacitance of as much as (but not limited to) 20 nf. If the clamping voltage is set to 1000v and then removed to 0V during the declamp process in a time of 20E-06 seconds, the clamp electrodes 13 must be rated to greater than 1 Amp in order to avoid stressing the electrode wiring.

To facilitate monitoring, the monitoring circuits of the SAC 25 may include sensitive current monitors 48. The information produced by these current monitors 48 may be used for:
   (a) checking for electrode-to-electrode leakage, which can be accomplished by monitoring the return DC current to the electrodes 13. The magnitude of the DC current difference can be compared to a threshold value to determine if too much leakage current is flowing.
   (b) monitoring the capacitance of the work piece 31, which can be accomplished by measuring the magnitude of the sinusoidal current generated by the low voltage sinusoidal wave form superimposed on the high voltage output. The magnitude of the current will be proportional to the load capacitance on the electrodes 13 by the equation $i = C\, dV/dt$.
   (c) monitoring the quality of the clamping operation, which can be accomplished by monitoring the capacitance of the system under various states, such as no wafer 31, wafer 31 present and wafer 31 clamped, and thereby gaining information about how a particular clamp behaves under these conditions, and establishing standard capacitance values corresponding to the various states. At a later time, should the monitored capacitance value deviate significantly from the standard values, the quality of the clamping can be questioned and investigated by the user.
   (d) monitoring for an open circuit, which can be accomplished by monitoring the capacitance afforded when no wafer 31 is present. When an open circuit exists, the capacitance will be zero, or very low (a deviation from the empirically determined system normal).

(e) monitoring other leakages, such as a current path to ground that is not associated with electrode-to-electrode leakage. Monitoring for a current path to ground can be accomplished by monitoring the sum of the DC currents. When the sum is not zero, there is a leakage current—i.e. current along a path other than to the electrode 13.

Embodiments of the invention may be equipped with an electrostatic voltmeter 51 ("ESVM"), which has a probe that may be positioned near a surface of the wafer 31. The purpose of the voltmeter 51 may be to provide feedback as to the residual voltage on the work piece 13 after a declamp sequence has been executed. The residual voltage detected by the ESVM probe is an indicator of the success of eliminating residual charge after the declamp process is complete. The success of a declamp process may be gauged by how close the residual voltage is to zero.

Above, it was noted that the SAC 25 may provide a sine wave to the CC 22 output signal, which is then fed to the amplifiers 28. The sensing signal is useful for determining the capacitance of the ESC. The capacitance may be determined by measuring the amplitude of the AC current resulting from the low voltage sine wave sensing signal that has been provided by the SAC 25, amplified and sent to the electrodes 13. This AC current may be measured by one of the following methods.

Figure 4:
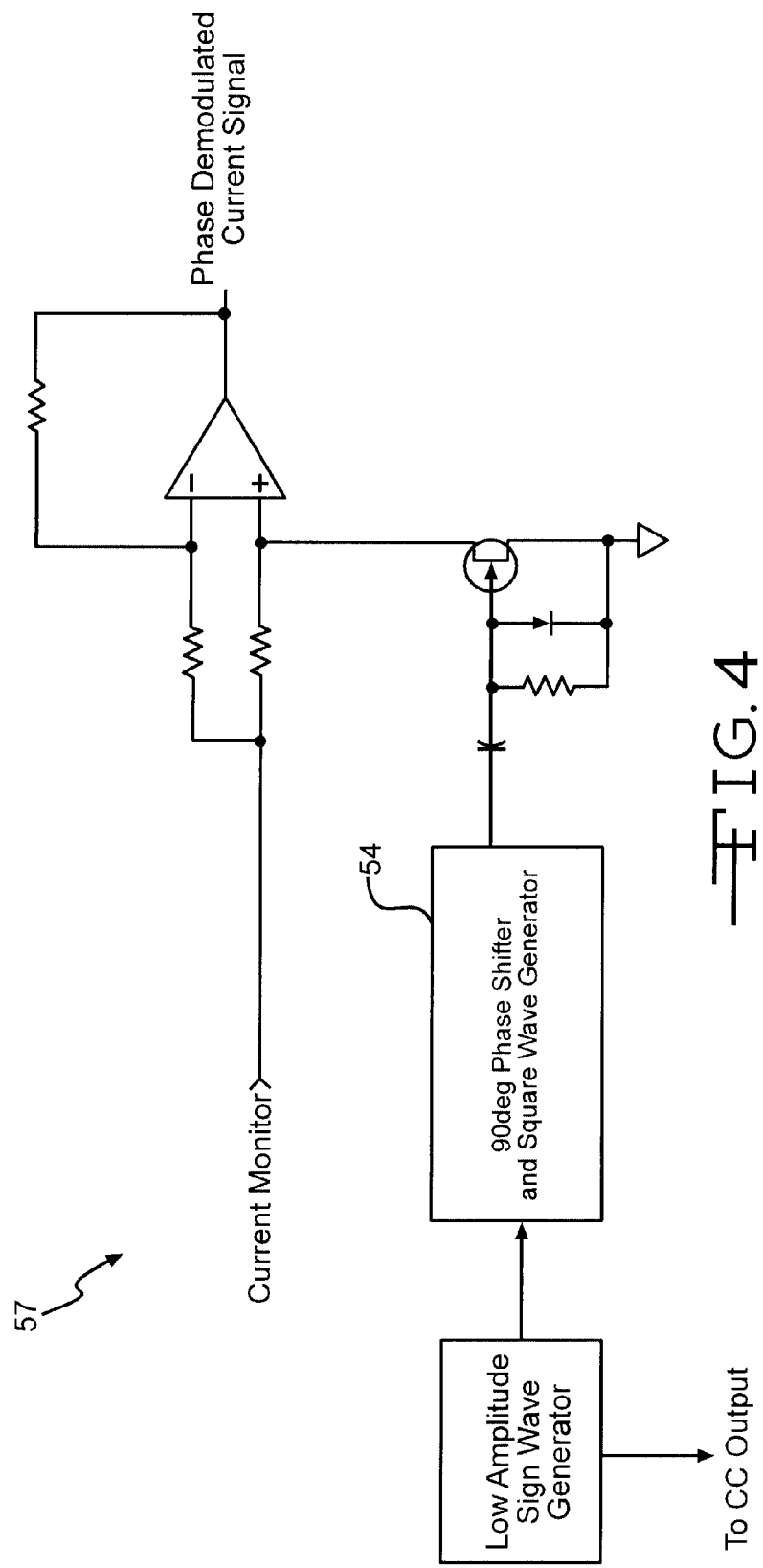
FIG. 4 is a block diagram of a phase-sensitive demodulator circuit.
Figure 5:
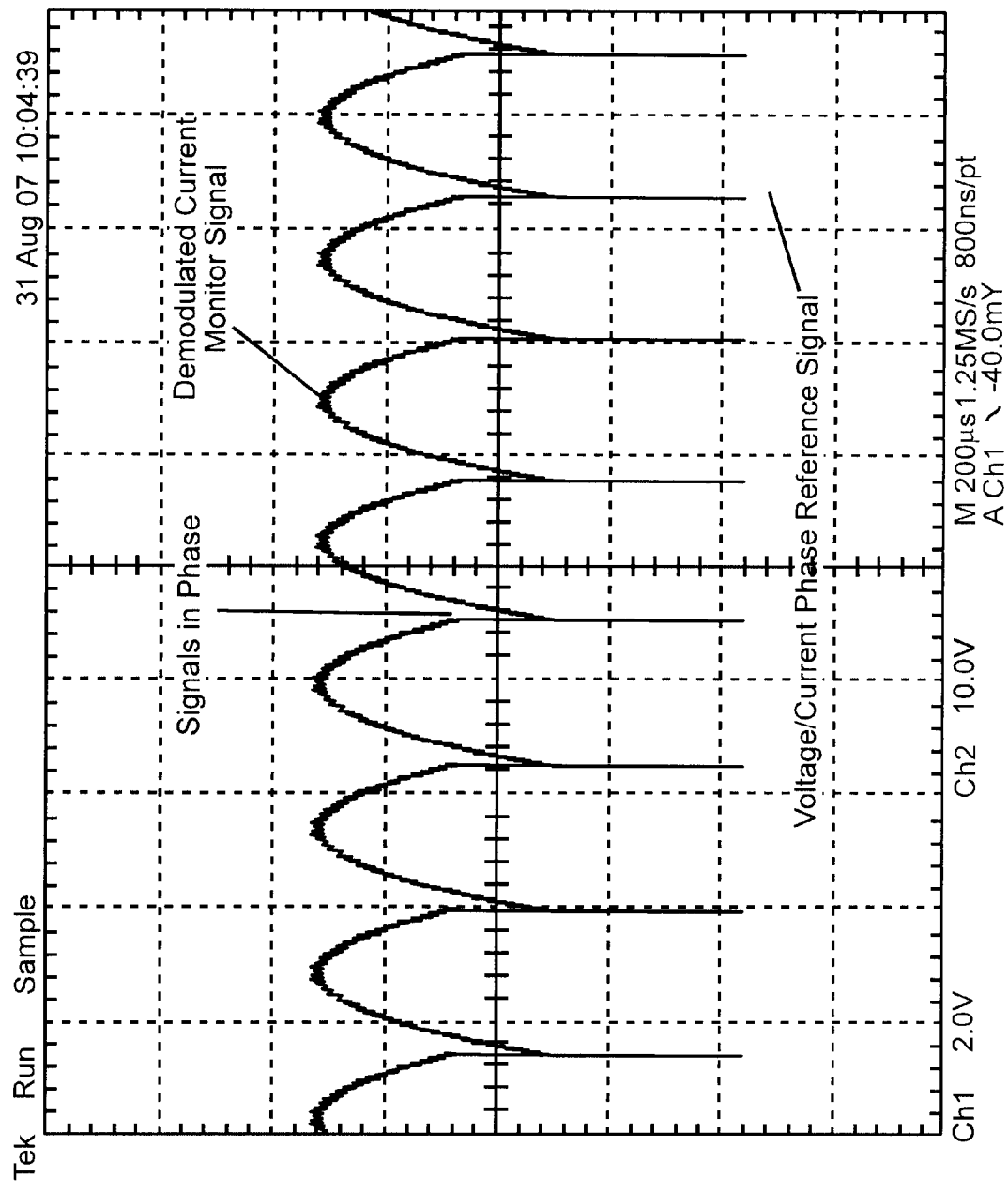
FIG. 5 is a graph of a demodulated current signal.

In a first of these methods a phase sensitive demodulator 54 ("PSD") is provided in the SAC 25. FIG. 4 depicts a PSD circuit 57. Since the current due to capacitance is known to be 90 degrees out of phase with respect to the voltage, the phase of the demodulator 54 is set for 90 degrees out of phase with respect to the output voltage sine wave. The PSD circuit 57 will monitor the change in current and produce a signal that is proportional to the AC current. The signal from the PSD circuit 57 is sent by the SAC 25 to the CC 22, where it is converted to a digital signal and provided to the computer 16. The computer 16 may then provide a graph corresponding to the digital signal. FIG. 5 shows such a graph.

Figure 6:
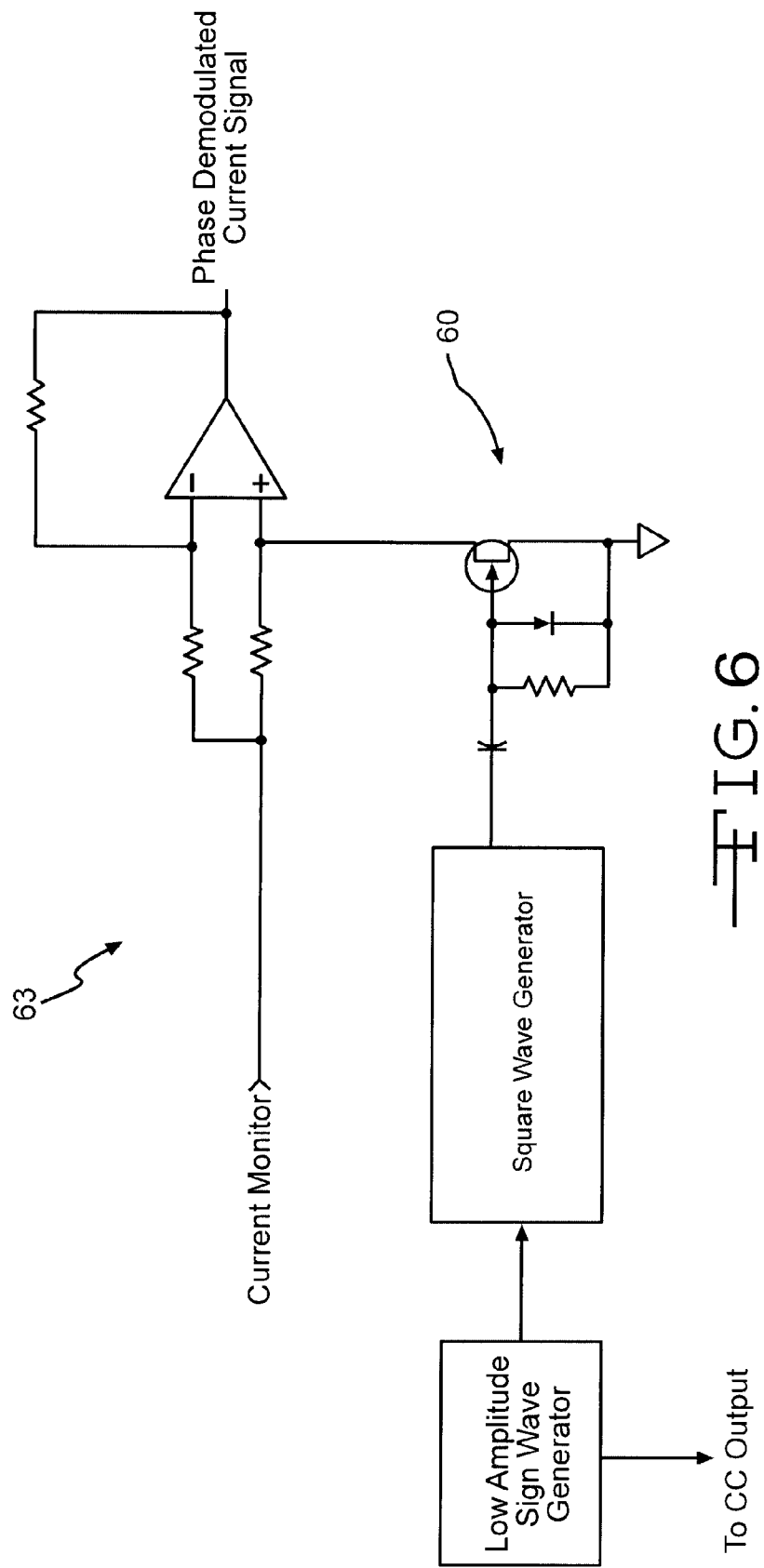
FIG. 6 is a block diagram of an additional demodulator circuit.
Figure 7:
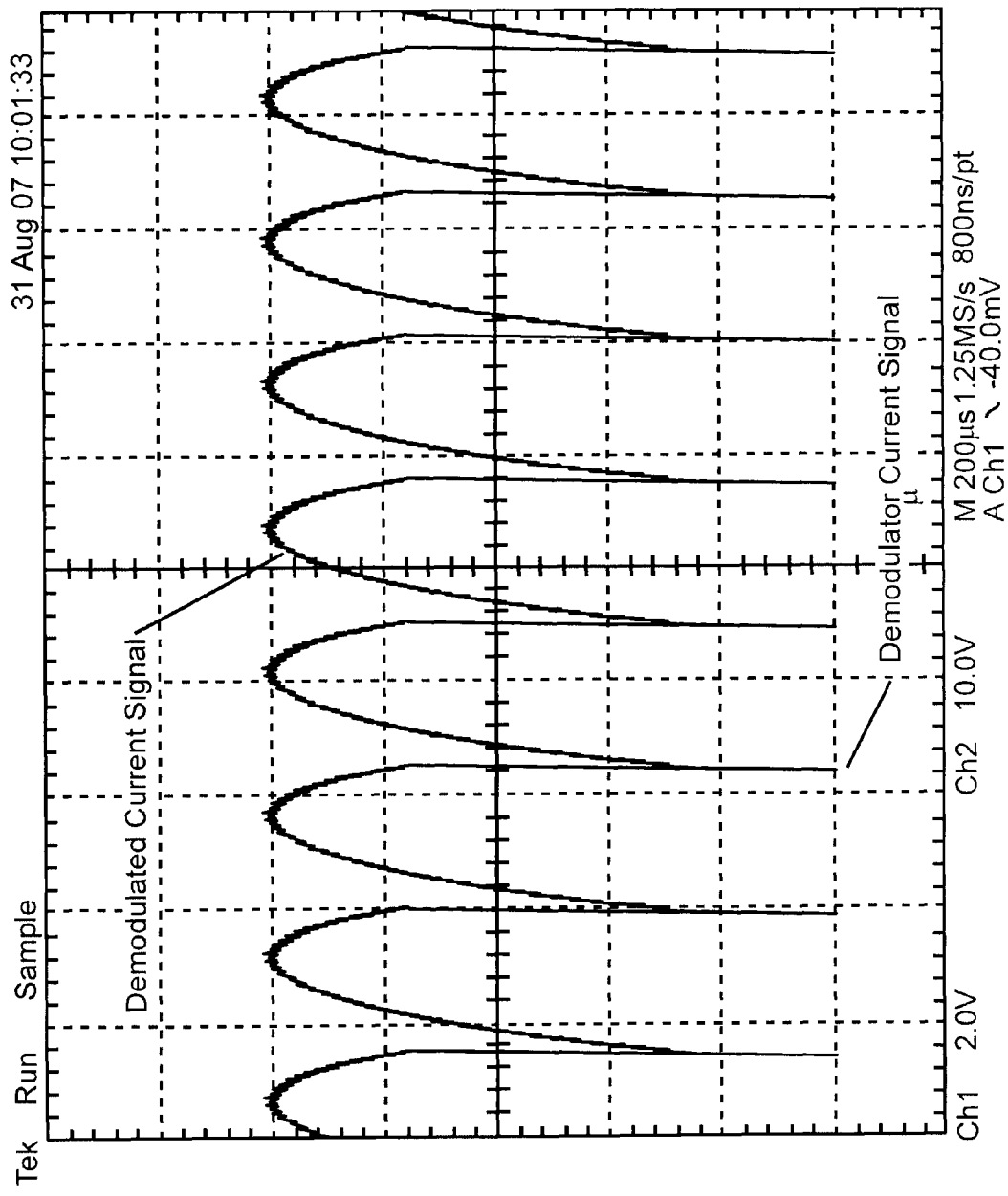
FIG. 7 is a graph of a demodulated current signal illustrating a phase shift with respect to FIG. 5, which was caused by a small resistance placed in series with the high voltage amplifier output.

After filtering and appropriate amplification, this signal is proportional to the capacitance of the electrostatic clamp system. Furthermore, an additional demodulator 60 can be added in phase with the amplifier voltage, and the resistive current can be separated out. FIG. 6 depicts a circuit 63 having an additional demodulator 60. Unfortunately, this method suffers from load phase shift. For example, if there is impedance in series with a high voltage amplifier 28 output that is not purely capacitive, the phase shifted demodulator circuit 57 can result in an erroneous reading. In FIG. 7, there is illustrated a phase shift from FIG. 5, which was caused by a small resistance placed in series with the high voltage amplifier 28 output. This is common in the semiconductor industry, where RF filters are often put in series with the ESC to shunt high power RF to ground.

Figure 8:
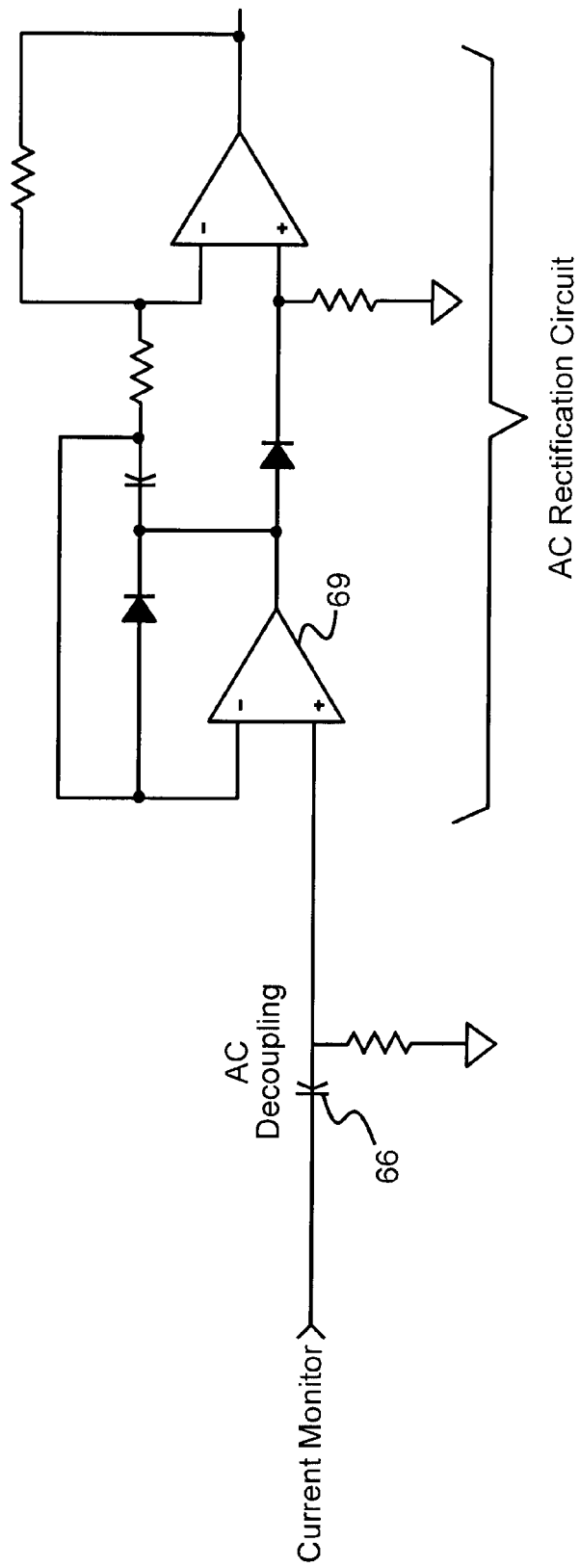
FIG. 8 depicts a circuit for measuring AC current.

In a second method, which is for measuring the AC current, the AC current portion is decoupled from the current monitor 48 through a large capacitor 66 and a high impedance op-amp 69. FIG. 8 depicts such a circuit. The decoupled AC signal is then rectified and filtered. After some amplification, the output signal is now proportional to the capacitance of the electrostatic clamp system. Since this method ignores the phase information, any non-capacitive impedance resulting in a phase shifted signal will no longer cause a demodulator shift error.

Figure 9:
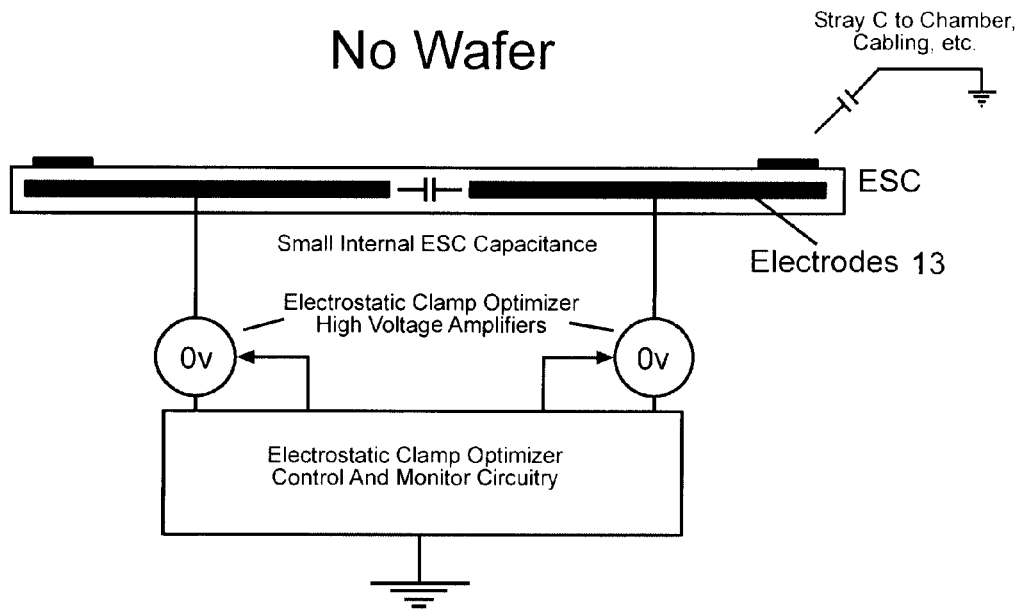
FIG. 9 depicts an ESC without a work piece (e.g. wafer)

The capacitance of the ESC is indicative of the state (three of which are described below) of the clamp. In one embodiment of the invention, the amplitude of the AC current (which is proportional to the capacitance) is monitored and used to detect which of three states are present. The three states are:

State #1. No Work Piece: This state is identified by a very small AC current amplitude (primarily from stray capacitance to ground and internal capacitive coupling from electrode to electrode). An ESC without a work piece 31 is illustrated in FIG. 9.

Figure 10:
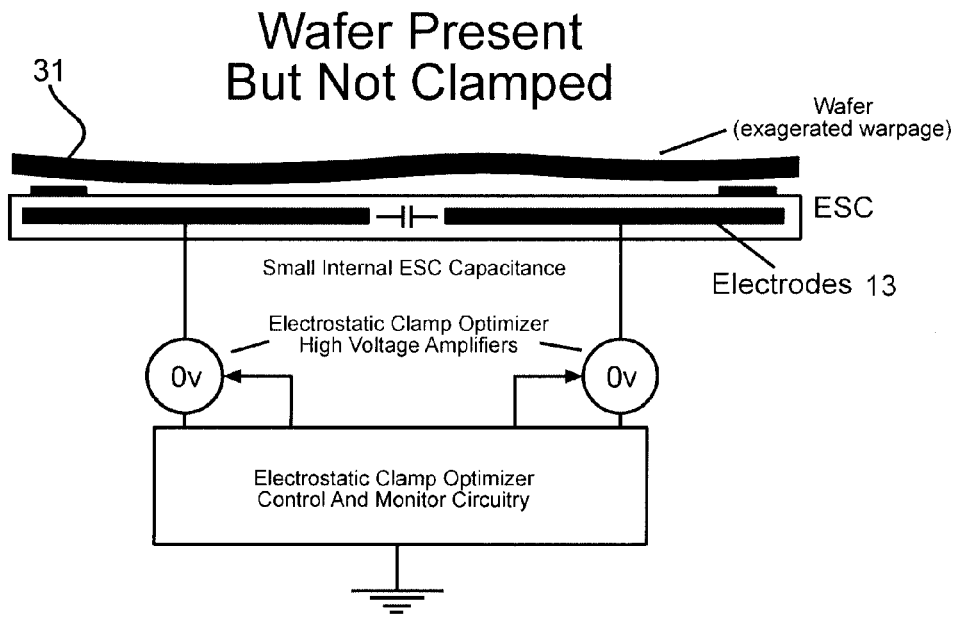
FIG. 10 depicts an ESC with an unclamped work piece.

State #2. Work Piece Present, But Not Clamped: This state is characterized as having a moderately high AC current amplitude due to the presence of the work piece 31. The work piece 31, barrier material and clamp electrode 13 forms a capacitor, but distortions and electrostatic clamp plateaus prevent a higher capacitance from being formed. An ESC with an unclamped work piece 31 is illustrated in FIG. 10.

Figure 11:
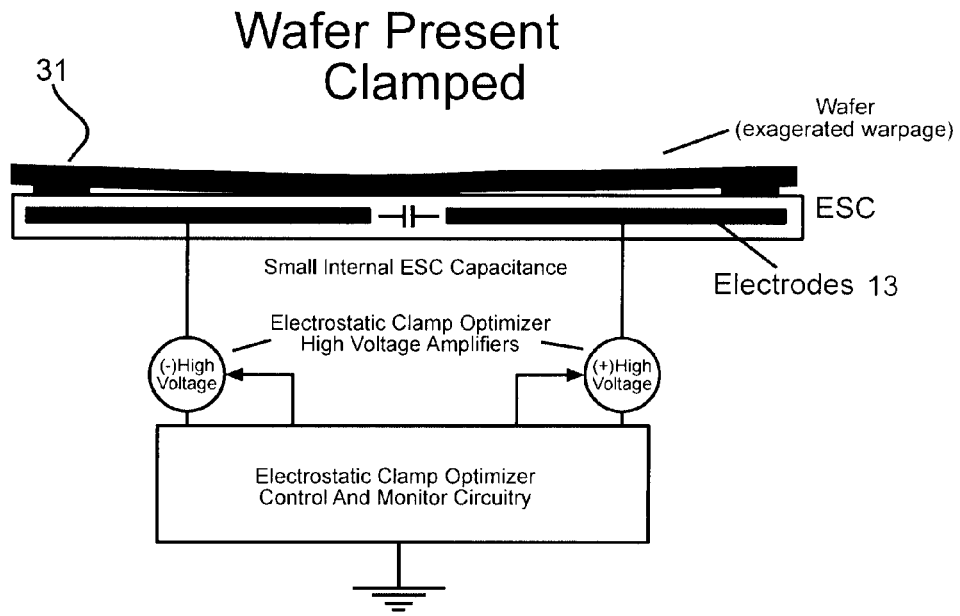
FIG. 11 depicts an ESC with a clamped work piece.

State #3. Work Piece Clamped: As the work piece 31 is pulled very close to the clamp electrodes 13, the capacitance is at its highest, and the AC current amplitude is large. An ESC with a clamped work piece 31 is illustrated in FIG. 11.

Figure 12:
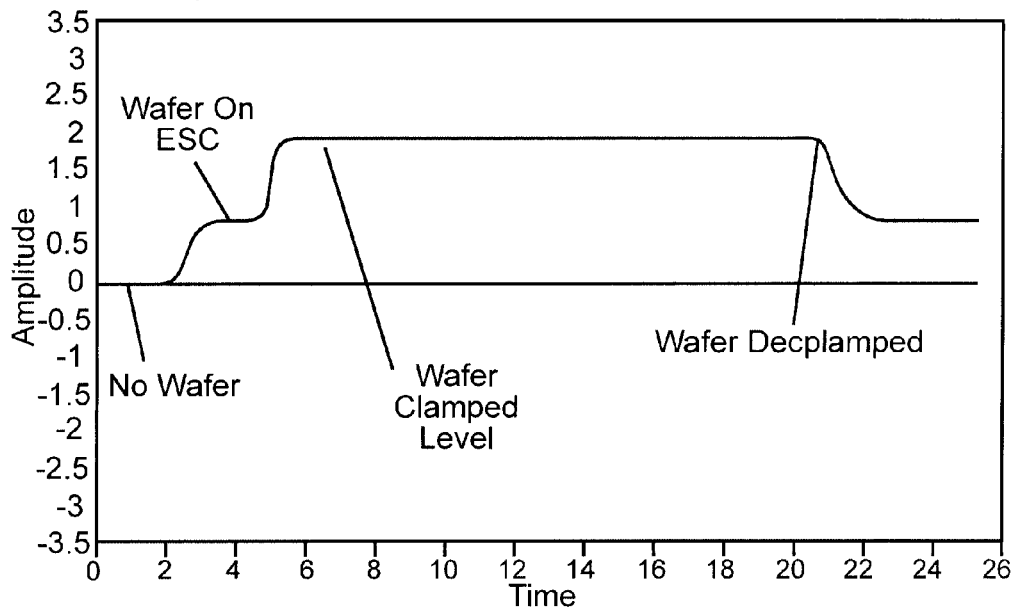
FIG. 12 is a graph depicting the capacitive levels, as indicated by AC current amplitude.

The capacitive levels, as indicated by AC current amplitude, are illustrated in the graph of FIG. 12.

In one embodiment of the invention, the SAC 25 may be provided with filters 72 which filter the output of the current monitors 48 in order to eliminate not only the AC current portion, but the system and power supply noise as well. FIG. 3 shows such filters 72. In this manner, low level DC currents can be monitored. This may be desirable because low levels of DC current are an early indication of impending clamp failure. In this regard, the circuits of the SAC 25 may be designed to detect and measure DC currents in the microampere range in order to determine whether the clamp is functioning properly. If the user determines that the clamp is not functioning properly, appropriate actions may be taken by the user in order to make the clamp function properly.

Additionally, in one embodiment of the invention, the SAC 25 has circuitry to monitor the DC current sum from the amplifiers 28, and the DC current difference between amplifiers 28. In the event that an ESC has resistive properties, the current difference (in the event of equal but opposite voltages on the ESC) can be monitored to verify that the currents are in an accepted range.

In addition, the DC current sum can be monitored for failures. If the sum is not zero, then a leakage to ground or a leakage from phase to phase may be an issue. Further, the SAC 25 may be equipped with circuitry to monitor the polarity of leakage, as well as determining the phase during which leakage occurs. By knowing the polarity of phase A, the polarity of the leakage can be determined. For example, if the sum of the DC currents is not zero, but is a positive value, and the output polarity of phase A is positive, the leakage may be determined to be from phase A to ground. Conversely, if the sum of the DC currents is negative and phase B is negative, then the leakage may be determined to be from phase B to ground.

The signals from the SAC 25 may be fed to the CC 22 for monitoring by the computer. The following signals may be monitored, but this is not an exhaustive list of what could be monitored:

a. phase A high voltage
b. phase B high voltage
c. current sum
d. current difference
e. capacitance
f. electrostatic voltmeter 51 output The computer 16 may be programmed to display these signals in graphic or table form via a monitor for analysis.

Although the present invention has been described with respect to one or more particular embodiments, it will be understood that other embodiments of the present invention may be made without departing from the spirit and scope of the present invention. Hence, the present invention is deemed limited only by the appended claims and the reasonable interpretation thereof.

What is claimed is:

1. A system for controlling an electrostatic clamp, comprising:
   a computer programmed to accept control information from a user, and provide digital commands corresponding to the control information;
   a control circuit having circuitry capable of accepting the digital commands, and providing an electrode control signal corresponding to the digital commands;
   a signal providing circuit for providing a sensing signal to the electrode control signal to produce a clamp signal;
   at least one amplifier, having an input port for receiving the clamp signal, and an output port for providing a high voltage control signal to at least one electrode of an electrostatic clamp; and
   a signal assessing circuit for monitoring performance of the electrostatic clamp by using the sensing signal.

2. The system of claim 1, wherein the computer provides an interface to the user in the form of a spreadsheet for entry of the control information.

3. The system of claim 2, wherein the spreadsheet has input boxes for entry of the control information.

4. The system of claim 1, wherein the sensing signal is a voltage sine wave.

5. The system of claim 1, wherein the signal assessing circuit includes current monitoring circuitry.

6. The system of claim 5, wherein the current monitoring circuitry monitors currents of the amplifier.

7. The system of claim 5, wherein the current monitoring circuitry monitors voltages of the amplifier.

8. A method of monitoring an electrostatic clamp, comprising:
   providing control information to a computer that is programmed to provide digital commands corresponding to the control information;
   creating the digital commands with the computer;
   receiving the digital commands at a control circuit having circuitry capable of accepting the digital commands, and providing an electrode control signal corresponding to the digital commands;
   creating the electrode control signal with the control circuit;
   providing a sensing signal and combining the sensing signal with the electrode control signal to produce a clamp signal;
   receiving the clamp signal at an amplifier;
   amplifying the clamp signal with the amplifier and providing a high voltage control signal to an electrode of an electrostatic clamp;
   monitoring operation of the electrostatic clamp by using the sensing signal; and
   providing monitoring information corresponding to the operation of the amplifier.

9. The method of claim 8, further comprising adjusting the control information in response to the monitoring information, and providing the adjusted control information to the computer.

10. The method of claim 8, wherein monitoring operation of the amplifier is accomplished by monitoring currents of the amplifier.

11. The method of claim 10, wherein the monitored currents include an AC current produced by the amplifier.

12. The method of claim 10, wherein the monitored currents include a DC current produced by the amplifier.

13. The method of claim 8, wherein monitoring operation of the amplifier is accomplished by monitoring voltages of the amplifier.

14. The method of claim 13, wherein the monitored voltages include a DC voltage of the amplifier.

15. The method of claim 13, wherein the monitored voltages include an AC voltage of the amplifier.

* * * * *